(12) United States Patent
Gans

(10) Patent No.: US 11,837,272 B2
(45) Date of Patent: Dec. 5, 2023

(54) METHODS FOR ROW HAMMER MITIGATION AND MEMORY DEVICES AND SYSTEMS EMPLOYING THE SAME

(71) Applicant: Lodestar Licensing Group LLC, Evanston, IL (US)

(72) Inventor: Dean D. Gans, Nampa, ID (US)

(*) Notice: Subject to any disclaimer, the term of this patent is extended or adjusted under 35 U.S.C. 154(b) by 16 days.

(21) Appl. No.: 17/328,419

(22) Filed: May 24, 2021

(65) Prior Publication Data

US 2021/0280236 A1 Sep. 9, 2021

Related U.S. Application Data

(63) Continuation of application No. 16/530,092, filed on Aug. 2, 2019, now Pat. No. 11,037,617.

(60) Provisional application No. 62/768,477, filed on Nov. 16, 2018, provisional application No. 62/729,229, filed on Sep. 10, 2018, provisional application No. 62/714,531, filed on Aug. 3, 2018.

(51) Int. Cl.
*G11C 11/406* (2006.01)
*G11C 16/34* (2006.01)

(52) U.S. Cl.
CPC .. *G11C 11/40618* (2013.01); *G11C 11/40615* (2013.01); *G11C 16/349* (2013.01)

(58) Field of Classification Search
CPC .................................................... G11C 11/406
USPC ................................................. 365/222, 49.1
See application file for complete search history.

(56) References Cited

U.S. PATENT DOCUMENTS

| | | | |
|---|---|---|---|
| 6,147,921 A | 11/2000 | Novak et al. | |
| 6,310,814 B1 | 10/2001 | Hampel et al. | |
| 8,941,935 B1 | 1/2015 | Aho et al. | |
| 9,384,821 B2 | 7/2016 | Bains et al. | |
| 9,761,298 B2 | 9/2017 | Halbert et al. | |
| 9,812,185 B2 | 11/2017 | Fisch et al. | |
| 10,049,755 B2 | 8/2018 | Lee et al. | |
| 10,127,974 B2 | 11/2018 | Kim et al. | |
| 10,817,371 B2 | 10/2020 | Rooney et al. | |

(Continued)

FOREIGN PATENT DOCUMENTS

| | | |
|---|---|---|
| KR | 20180003713 A | 1/2018 |
| WO | 2006130276 A1 | 12/2006 |

OTHER PUBLICATIONS

KR Patent Application No. 10-2021-7006048—Korean Notice of Allowance, dated Jul. 20, 2022, with English Translation, 4 pages.

(Continued)

*Primary Examiner* — Jason Lappas
(74) *Attorney, Agent, or Firm* — Holland & Hart LLP

(57) ABSTRACT

A method of operating a memory device is provided, comprising determining a number of operations corresponding to a memory location during a first timing period; and scheduling an extra refresh operation for the memory location after the first timing period when the determined number of operations exceeds a predetermined threshold. A memory device is provided, comprising a memory including a memory location; and circuitry configured to: determine a number of operations corresponding to the memory location during a first timing period; and schedule an extra refresh operation for the memory location after the first timing period when the determined number of operations exceeds a predetermined threshold.

21 Claims, 6 Drawing Sheets

(56) References Cited

U.S. PATENT DOCUMENTS

| | | |
|---|---|---|
| 11,087,819 B2 | 8/2021 | Cowles et al. |
| 11,294,762 B2 | 4/2022 | Rooney et al. |
| 2008/0183916 A1 | 7/2008 | Bellows et al. |
| 2008/0232184 A1 | 9/2008 | Ohsawa |
| 2010/0157650 A1 | 6/2010 | Hashimoto et al. |
| 2011/0255357 A1 | 10/2011 | Pelley et al. |
| 2012/0155201 A1 | 6/2012 | Schreck et al. |
| 2013/0304982 A1 | 11/2013 | Jung et al. |
| 2014/0006703 A1 | 1/2014 | Bains et al. |
| 2014/0059287 A1 | 2/2014 | Bains et al. |
| 2014/0095780 A1 | 4/2014 | Bains et al. |
| 2014/0122788 A1 | 5/2014 | Swaminathan |
| 2014/0156923 A1 | 6/2014 | Bains et al. |
| 2014/0173239 A1 | 6/2014 | Schushan |
| 2014/0192605 A1 | 7/2014 | Crawford et al. |
| 2015/0109871 A1 | 4/2015 | Bains et al. |
| 2015/0206558 A1 | 7/2015 | Ni et al. |
| 2015/0279441 A1 * | 10/2015 | Greenberg .......... G11C 11/406 365/49.1 |
| 2015/0339188 A1 | 11/2015 | Hu et al. |
| 2016/0118132 A1 | 4/2016 | Prins et al. |
| 2017/0110178 A1 | 4/2017 | Bains |
| 2017/0186481 A1 | 6/2017 | Oh et al. |
| 2018/0004415 A1 | 1/2018 | Lee et al. |
| 2018/0061483 A1 | 3/2018 | Morgan |
| 2020/0043545 A1 | 2/2020 | Gans |
| 2020/0111525 A1 | 4/2020 | Cowles et al. |
| 2020/0210278 A1 | 7/2020 | Rooney et al. |
| 2021/0042185 A1 | 2/2021 | Rooney et al. |
| 2021/0065831 A1 | 3/2021 | Galbraith et al. |
| 2021/0358539 A1 | 11/2021 | Cowles et al. |

OTHER PUBLICATIONS

EP Patent Application No. 19871839.7—European Search Report, dated Jun. 1, 2022, 10 pages.

KR Patent Application No. 10-2021-7013688—Korean Office Action and Search Report, dated May 10, 2022, with English Translation, 13 pages.

EP Patent Application No. 19843248.6—European Search Report, dated Mar. 18, 2022, 8 pages.

International Application No. PCT/US2019/044857—International Search Report and Written Opinion, dated Nov. 21, 2019, 11 pages.

International Application No. PCT/US2019/055447—International Search Report and Written Opinion, dated Jan. 31, 2020, 10 pages.

KR Patent Application No. 10-2021-7006048—Korean Office Action and Search Report, dated Dec. 15, 2021, with English Translation, 10 pages.

International Application No. PCT/US2019/065220—International Search Report and Written Opinion, dated Apr. 9, 2020, 10 pages.

KR Patent Application No. 10-2022-7036616—Korean Notice of Allowance, dated Jun. 7, 2023, with English Translation, 7 pages.

* cited by examiner

METHODS FOR ROW HAMMER MITIGATION AND MEMORY DEVICES AND SYSTEMS EMPLOYING THE SAME

CROSS-REFERENCE TO RELATED APPLICATIONS

This application is a continuation of U.S. application Ser. No. 16/530,092, filed Aug. 2, 2019; which claims the benefit of U.S. Provisional Application Nos. 62/714,531, filed Aug. 3, 2018; 62/729,229, filed Sep. 10, 2018; and 62/768,477, filed Nov. 16, 2018; each of which is incorporated herein by reference in its entirety.

TECHNICAL FIELD

The present disclosure generally relates to methods for row hammer mitigation and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Figure 1:
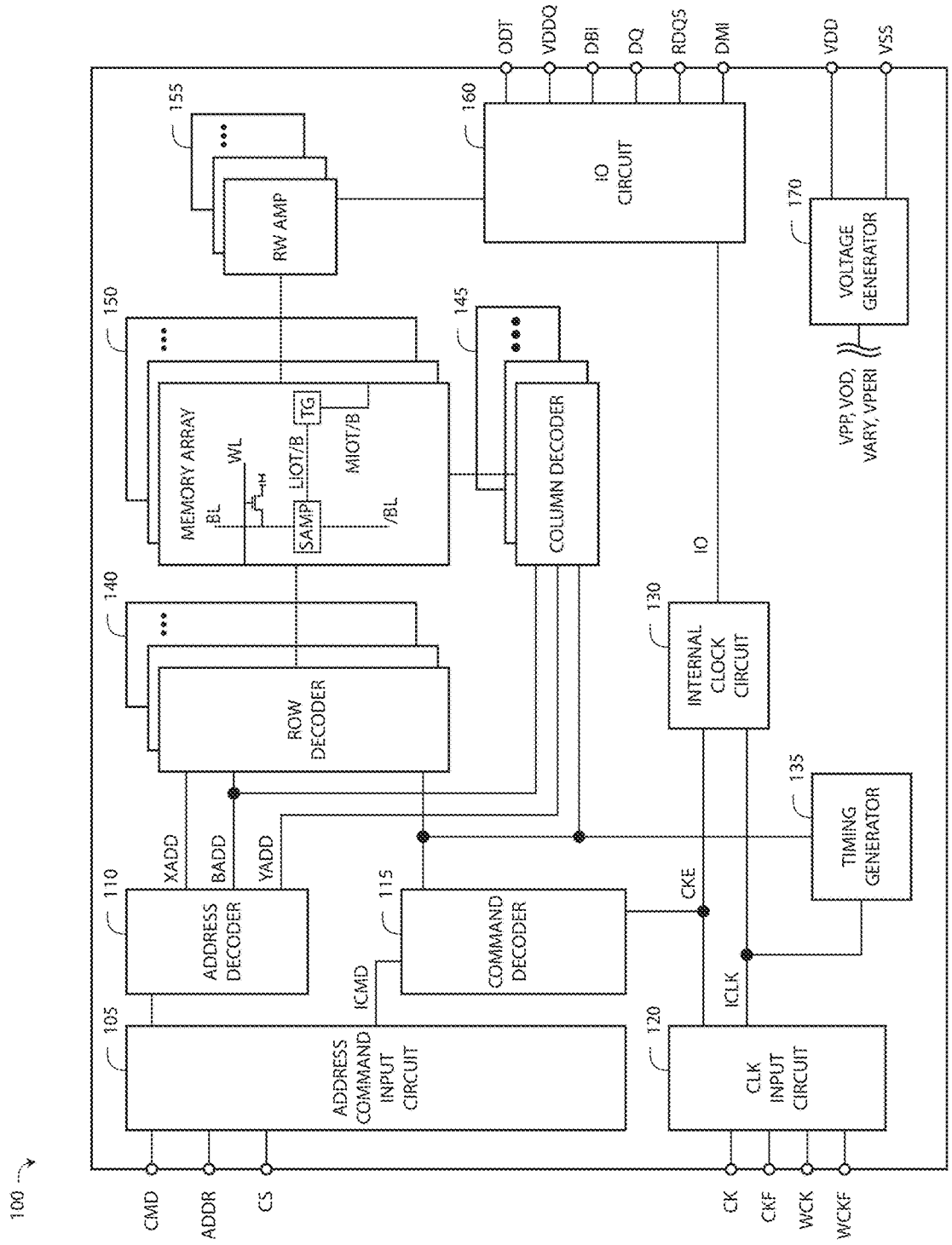
FIG. 1 is a simplified block diagram schematically illustrating a memory device in accordance with an embodiment of the present technology.

High data reliability, high speed of memory access, and reduced chip size are features that are demanded from semiconductor memory. Some semiconductor memory devices, such as DRAM, stores information as charge accumulated in cell capacitors that can be prone to leakage, and which therefore require periodic refresh operations to prevent the information from being lost. In addition to charge leakage, the information may be lost or degraded by bit errors caused by disturb mechanisms such as row hammer. Row hammer affects memory cells coupled to a non-selected word line adjacent to (e.g., immediately adjacent or with a small distance of) a selected word line that is repeatedly driven to an active level in a short time. The activity on the adjacent (e.g., nearby) word line can cause the charge in the cells of the non-selected word line to vary, putting the information stored therein at risk, unless a refresh operation is performed to refresh the charge in the memory cells.

In some memory devices, auto-refresh (AREF) commands indicating refresh operations are periodically issued from a control device such as a host or a controller operably coupled to the memory device. The AREF commands are provided from the control device at a frequency that all the word lines are certainly refreshed once in the one refresh cycle. The duration of the refresh cycle may be selected according to an operating temperature of the memory device (e.g., with warmer temperatures generally warranting more frequent refresh operations) to prevent charge leakage from causing data degradation. As the refresh addresses according to the AREF commands are determined by a refresh counter provided in DRAM, refresh operations responsive to the AREF commands may not prevent bit errors due to row hammer effects.

One approach to ensuring that refresh operations are provided frequently enough to address row hammer effects involves increasing the frequency with which all of the memory portions are refreshed. Because refresh operations can be power intensive, however, scheduling more frequent refresh operations for all of the memory portions based on a worst-case scenario of row hammer effects may be inefficient, and particularly undesirable for memory applications in which power consumption is a significant concern (e.g., mobile devices powered by a limited battery supply).

Another approach to addressing row hammer effects providing a memory device with circuitry to redirect or steal a portion of the available refresh opportunities (e.g., the regularly scheduled refresh commands received from a host device) to specific rows where hammer activity has been detected (e.g., adjacent or nearby to a row where a large number of activation commands have been executed). With the continual reduction in size of memory arrays, and the corresponding increase in sensitivity to row hammer effects, the number of activates that can be allowed to occur at an adjacent row (e.g., a row within a small number of rows in distance, within which the effects are non-negligible) before a row is refreshed continues to decrease. This presents a challenge for the refresh opportunity redirecting approach, as eventually there may no longer be enough refresh commands available to redirect for row hammer mitigation.

Accordingly, several embodiments of the present technology are directed to memory devices, systems including memory devices, and methods of operating memory devices in which extra refresh operations can be scheduled on an as-needed basis for those memory portions where activity (e.g., activations in excess of a predetermined threshold) warrants an out-of-sequence refresh operation. In one embodiment, a method of operating a memory device comprises determining a number of operations corresponding to a memory location during a first timing period; and scheduling an extra refresh operation for the memory location after the first timing period when the determined number of operations exceeds a predetermined threshold.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120.

The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be configured to perform refresh operations on portions of the memory array 150 in response to commands received from a connected host device or memory controller. The memory device 100 can track the addresses of the memory array 150 at which refresh operations are performed (e.g., in an address pointer), and can further track the number of refresh operations performed at the most recent address (e.g. in a bank counter). This arrangement can ensure that each bank 0-15 of the memory array 150 experiences at least one refresh operation (e.g., by counting sixteen operations) at a given address before the address pointer is incremented and the cycle is repeated.

According to one aspect of the present disclosure, a host device or controller operably connected to the memory device 100 can be configured to send refresh commands to the memory device 100 to trigger the refresh operations. Because refresh operations can prevent a memory device from communicating over the data bus for a number of clock cycles, efficient scheduling of bus utilization can be ensured by managing refresh operations from the controller/host device.

As set forth above, row hammer effects can degrade the information stored in the memory array 150, such that modes of operation with greater delay between refresh operations can potentially put data integrity at risk. Accordingly, in various embodiments of the present disclosure, a host device or controller can be configured to issue extra refresh commands (e.g., in addition to the regularly-scheduled periodic refresh commands) to mitigate the effects of row hammer in the memory device 150.

One approach to mitigating row hammer includes determining when a number of memory operations (e.g., activations) at a memory location (e.g., memory bank, a group of memory cells, rows, or columns at the sub-bank level, etc.) exceeds a predetermined threshold during a first timing period (e.g., a refresh interval), and scheduling an extra refresh operation in response to the determination after the timing period. Such an approach is illustrated schematically in the timing diagram 200 of FIG. 2, in accordance with one aspect of the present technology.

Figure 2:
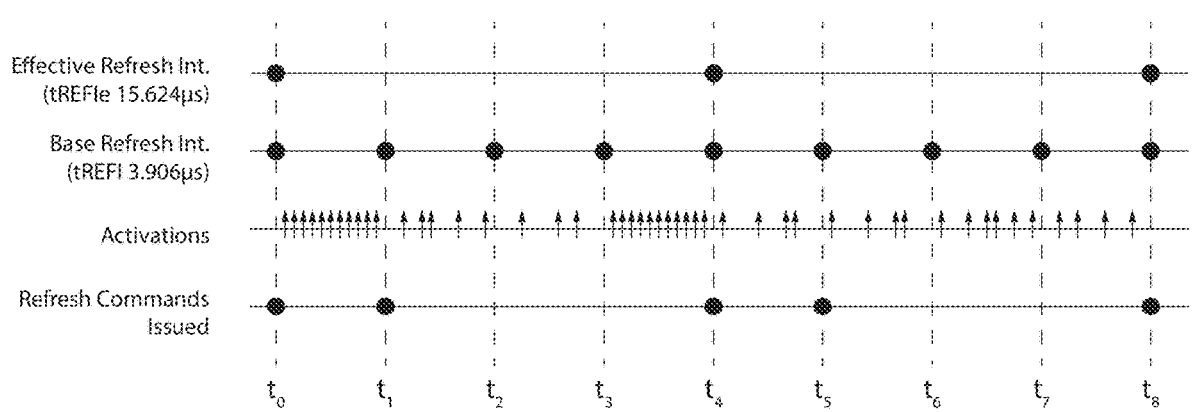
FIG. 2 is a simplified timing diagram illustrating a method for row hammer mitigation in accordance with embodiments of the present technology.

As can be seen with reference to FIG. 2, in a memory device or system operating in a 4× refresh mode (e.g., with a 15.624 µs effective refresh interval (tREFIe) four times larger than a 3.906 µs base refresh interval (tREFI)), the host device/controller is configured to send a refresh command to the illustrated memory location (e.g., memory bank) after the completion of every fourth base refresh interval (e.g., at times $t_0$, $t_4$, $t_5$, etc.). When the host device/controller detects an amount of activity (e.g., activations) at the memory location that exceeds a predetermined threshold, the host device/controller can send an extra refresh command, permitting the memory device to perform an extra refresh operation for the mitigation of the adverse effects of the activity (e.g., the row hammer effects). With reference to the timing diagram 200, it can be seen that in the interval between times to and ti, a large number of activations occurred. Accordingly, an extra refresh command is issued at time ti, permitting the memory device to refresh the charge in the impacted memory cells.

In some circumstances, it may happen that excess activation occurs in a time period at the end of which a regularly-scheduled refresh command (not an extra refresh command) is already scheduled to be issued. In these circumstances, an extra refresh command can be issued in a subsequent time period (e.g., not immediately after the time period in which the excess activation activity occurred). For example, with reference to the timing diagram 200, in the interval between times $t_3$ and $t_4$, a large number of activations occurred, but a refresh command is already scheduled to be issued (e.g., in accordance with the 15.624 µs tREFIe) at time $t_4$. Accordingly, the extra refresh command is issued at the end of a subsequent time period (e.g., at time $t_5$). In this regard, the memory device is free to 'steal' either of the refresh commands at times $t_4$ or $t_5$ to perform the row hammer mitigation refresh at the memory location impacted by the large number of activations, and to use the other to refresh the memory addresses to which the originally-scheduled refresh operation was directed (e.g., by 'stealing' the refresh command at time $t_4$, immediately after the excess activation, the impacted address can be refreshed, and the address to which the refresh address pointer was pointing can have its refresh operation deferred until the extra refresh command at time $t_5$ is received).

Figure 3:
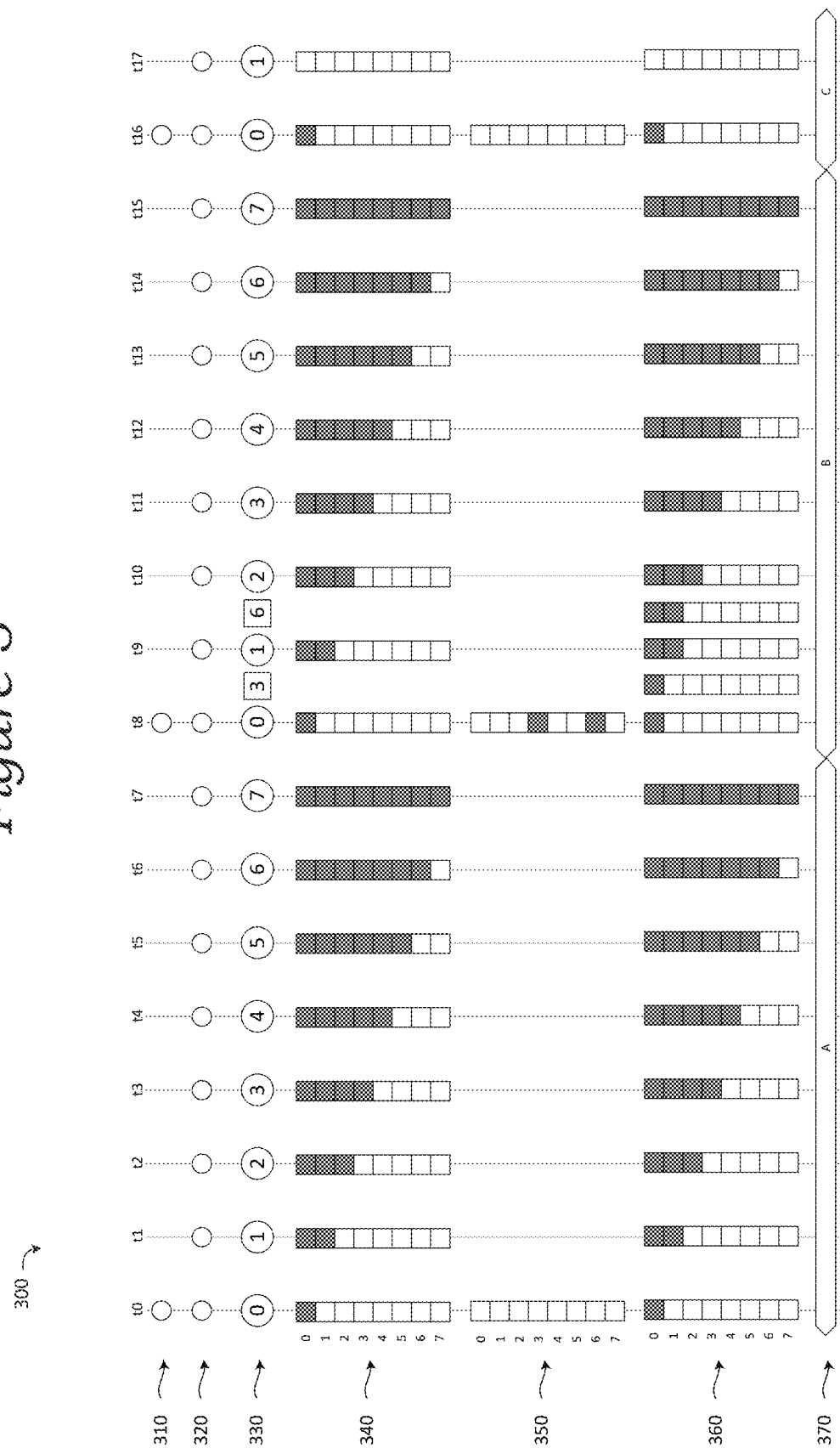
FIG. 3 is a simplified timing diagram illustrating a method for row hammer mitigation in accordance with embodiments of the present technology.

Although in the simplified example of FIG. 2, a memory device with a single bank is illustrated, the foregoing method of issuing extra refresh commands has application to memory devices with multiple memory banks as well. For example, FIG. 3 is a simplified timing diagram illustrating a method for row hammer mitigation in a memory device having multiple banks in accordance with embodiments of the present technology. As can be seen with reference to FIG. 3, a memory device with eight memory banks can be configured to perform a refresh operation at each bank in sequence (e.g., corresponding to the REFpb interval 320 and the effective refresh interval 310), before updating an address pointer 370 and repeating the process (e.g., the refresh operations at times t0 through $t_7$), as set forth in greater detail above. Both the memory device and the connected host device/controller can maintain a counter tracking the refresh operations performed at each bank (e.g., SoC bank counter 340 and DRAM bank counter 360), to ensure that each bank experiences at least one refresh operation (e.g., to the address indicated in the address pointer 370) before the counter is reset and the address pointer incremented. The controller can also maintain a counter 350 that tracks a number of activations (e.g., or other operations) at each bank to determine when a predetermined number (e.g., stored in a mode register of the memory device) of operations is exceeded, triggering an extra refresh command.

For example, at time $t_8$, the bank activity counter 350 indicates that banks 3 and 6 have experienced more than the threshold level of operations in a preceding time period (e.g., in the period between time to and time $t_7$, or in a shorter period such as that between times $t_6$ and $t_7$). Accordingly, the host device/controller is configured to issue extra refresh commands 330 to banks 3 and 6, as shown between times $t_8$ and $t_{10}$. At this point, the behavior of the bank counters in the memory device (e.g., DRAM bank counter 360) and in the host device/controller (e.g., SoC bank counter 340) diverges. The bank counter 340 in the host device/controller continues to track only the regularly-scheduled refresh operations directed to each bank (to prevent a premature reset of the counter that would trigger an update to the refresh pointer), and the bank counter 360 in the memory device counts the first refresh operation at each bank. In this regard, when the bank counter 360 in the memory device receives a subsequent refresh command 330 directed to a bank that is already indicated in the bank counter 340 as having received a refresh command, the memory device can be configured to utilize this subsequent refresh command to mitigate the effects of row hammer at an address other than the one indicated in the refresh address pointer 370. For example, at times $t_{11}$ and $t_{14}$, refresh commands 330 to banks 3 and 6 are issued, respectively, but the bank counter 340 of the memory device reflects that refresh commands have already been received at these banks without an intervening counter reset. Accordingly, the memory device can utilize either of the earlier- or later-received refresh commands at each of the banks to perform a row-hammer-mitigating refresh operation at an address impacted by the excessive number of activations. Following the successful issuance of extra refresh commands to the affected banks, the host device/controller can reset the bank activity counter 350, as shown at time $t_{16}$.

According to one aspect of the present technology, the command sent by a connected host device can differ from a refresh command, such that the memory device receiving the command can limit its refresh operation to victim rows, and not expend unnecessary time or power refreshing other rows that have not experienced row hammer effects. In this regard, in a LPDDR5 embodiment, a refresh command can be modified to include a command bit indicating whether it is a refresh management command (RFM), as shown in Table 1, below:

TABLE 1

| Command | Bank Org | CS | CA0 | CA1 | CA2 | CA3 | CA4 | CA5 | CA6 | CK |
|---|---|---|---|---|---|---|---|---|---|---|
| Refresh (per-bank, all-bank) | Any | H | L | L | L | H | H | H | L | R1 |
| RFM (per-bank, all-bank) | BG 16B 8B | X | BA0 | BA1 | BG0 BA2 | RFM | V | V | AB | F1 |

In this regard, the F1 edge of CA3 is 'V' when the foregoing approach to refresh management is not required, but becomes RFM when refresh management is required (e.g., as determined by a mode register setting implemented by the manufacturer, vendor, or end user of the memory device). The mode register can include a bit indicating whether refresh management is implemented or not, and can further include additional bits indicating the rolling accumulated activations initial management threshold (RAAIMT) permitted per time period (e.g., tREFIe) before a row hammer mitigation command is issued. One such mode register is illustrated by way of example in Table 2, below:

TABLE 2

| Function | Operand | Data | Notes |
|---|---|---|---|
| RFM | [0] | 0b = RFM not required<br>1b = RFM required | Vendor programmed |
| RAAIMT (Rolling Accumulated ACT Initial Management Threshold) | [5:1] | 000000b = invalid<br>000001b = 8<br>000010b = 16<br>... (step +8)<br>111110b = 240<br>111111b = 248 | Vendor programmed |
| RAAMULT (Rolling Accumulated ACT Multiplier) | [7:6] | 00: 2X<br>01: 4X<br>10: 6X<br>11b: 8X | RAAMMT = RAAMULT * RAAIMT |

The value set for RAAIMT in the mode register may be vendor specific (e.g., dependent upon the susceptibility of each array design to row hammer effects) and may further be dependent upon the refresh multiplier in effect. In accordance with another aspect of the present disclosure, the RAAIMT value can be provided on a per-logical-bank basis (e.g., 16 RAAIMT counters for 16 logical banks). With this approach, REFhp commands would be issued based on the maximum of the two count values that form a refresh bank. In another approach, one RAAIMT counter can be provided for each refresh bank (e.g., two BG or 16B mode banks), saving eight counters per channel, but causing the RAAIMT value to be reached more often and triggering more RFM commands.

Although the foregoing examples have been described with respect to LPDDR5 memory devices, the advanced row hammer mitigation techniques of the present disclosure can also be implemented in other memory devices, including LPDDR4 memory devices. For example, in a LPDDR4 embodiment, a refresh command can be modified to include a command bit indicating whether it is a row hammer mitigation (RFM) refresh command, as shown in Table 3, below:

TABLE 3

| Command | CS | CA0 | CA1 | CA2 | CA3 | CA4 | CA5 | CK |
|---|---|---|---|---|---|---|---|---|
| Refresh (per-bank, all-bank) | H | L | L | L | H | L | AB | R1 |
| RFM (per-bank, all-bank) | L | BA0 | BA1 | BA2 | RFM | V | V | R2 |

In this regard, the F1 edge of CA3 is 'V' when the foregoing approach to refresh management is not required, but becomes RFM when refresh management is required (e.g., as determined by a mode register setting implemented by the manufacturer, vendor, or end user of the memory device). The mode register can include a bit indicating whether refresh management is implemented or not, and can further include additional bits indicating the RAAIMT permitted per time period (e.g., tREFIe) before a row hammer mitigation command is issued. One such mode register is illustrated by way of example in Table 5, below:

TABLE 4

| Operand | Data | Notes |
|---|---|---|
| [O] | 0b = RFM not required<br>1b = RFM required | Vendor specific |
| [5:1] | MAC value 9:4<br>000000b = invalid<br>000001b = 16<br>000010b = 32<br>. . .<br>110000b = 768<br>110001b = 784<br>110010b-111111b Reserved | Device specific |

The value set for RAAIMT in the mode register may be vendor specific (e.g., dependent upon the susceptibility of each array design to row hammer effects) and may further be dependent upon the refresh multiplier in effect.

In accordance with one aspect of the present disclosure, when an RFM command is issued to the memory device, the rolling accumulative activations (RAA) counter in any bank receiving the command can be decremented. The amount by which to decrement the RAA counter in response to an RFM command can be determined by a RAAIMT multiplier value RAADEC, which can be stored in a mode register table of the memory device. Issuing an RFMab command allows the RAA count in all banks to be decremented by the RAAIMT multiplied by the RAADEC value. Issuing an per-bank RFM command (RFMpb) can be configured to decrement the RAA counter for the bank specified by the RFMpb command (e.g., decremented by RAAIMT*RAADEC). If the amount of the decrement would cause the RAA counter to fall below 0, the RAA counter can be constrained to 0. In this regard, according to one aspect of the subject disclosure, by constraining RAA to a non-negative value, the "pull-in" of RFM commands, can be prevented. Preventing the pull-in of commands will prevent the situation in which a bank is "credited" for a refresh operation before excessive activations occurred, and ensures that refresh operations follow, rather than precede, the activations which trigger them.

According to another embodiment of the present disclosure, RFM commands can be configured to accumulate or "postpone" (e.g., multiple RFM commands can be directed to a memory region, but execution of the corresponding refresh operation can be deferred), but the RAA counter can be configured so as not to exceed the vendor specified RAA Maximum Management Threshold (RAAMMT), which can be determined by multiplying the RAAIMT value by the RAAMULT value and set by the DRAM vendor in a mode register table of the memory device. If postponing multiple RFM commands causes the RAA counter for a bank to reach the RAAMMT threshold, the memory device can be configured to disallow additional activate (ACT) commands directed to that bank until one or more REF or RFM commands have been issued to reduce the RAA counter below the maximum value. Issuing a REF command can be configured to permit the RAA counter to be decremented by RAAIMT for the bank or banks being refreshed. Hence, any periodic REF command issued to the LPDRAM allows the RAA counter of the banks being refreshed to be decremented by the RAAIMT value every tREFIe. Issuing an all-bank refresh command (REFab) can permit the RAA count in all banks to be decremented. Issuing a REFpb command with a bank address may be configured to permit the RAA count only with that bank address to be decremented. Entering and/or exiting Self Refresh mode may be configured to permit no decrement to the RAA count values. Accordingly, the per bank count values before Self Refresh is entered remain unchanged upon Self Refresh exit.

Table 5, below, illustrates a number of example refresh management operations of a memory device according to a variety of different device states, in accordance with one embodiment of the present disclosure.

TABLE 5

| Device-Specific RFM Parameters | | | | | Device State | | |
|---|---|---|---|---|---|---|---|
| RAAIMT | RAAMULT | RAADEC | RFMSB | RFMTH | tREFIe | RAA | Behavior |
| 160 | 4x | 2x | 1 | 9600 ns<br>(160 × 60 ns) | 7.8 µs | 120 | RAA < RAAIMT and tREFIe ≤ RFMTH,<br>no commands issued |
| 160 | 4x | 2x | 1 | 9600 ns | 7.8 µs | 500 | tREFIe ≤ RFMTH,<br>no commands issued |
| 160 | 4x | 2x | 1 | 9600 ns | 15.6 µs | 120 | RAA < RAAIMT,<br>no commands issued |
| 160 | 4x | 2x | 1 | 9600 ns | 15.6 µs | 500 | RAA > RAAIMT and RAA < RAAMMT<br>RFM command can be issued and postponed |

TABLE 5-continued

| Device-Specific RFM Parameters | | | | | Device State | | |
|---|---|---|---|---|---|---|---|
| RAAIMT | RAAMULT | RAADEC | RFMSB | RFMTH | tREFIe | RAA | Behavior |
| 160 | 4x | 2x | 1 | 9600 ns | 15.6 μs | 640 | RAA = RAAMMT, no ACT until REF or RFM command issued. Issuing one RFMpb or RFMab will reduce RAA to 320 since RAADEC = 2x. Issuing one REFpb or REFab will reduce RAA to 480. |
| 120 | 4x | 1.5x | 1 | 7200 ns | 7.8 μs | 480 | RAA = RAAMMT, no ACT until REF or RFM command issued. Issuing one RFMpb or RFMab will reduce RAA to 300 since RAADEC = 1.5x. Issuing one REFpb or REFab will reduce RAA to 360. |

In accordance with one aspect of the present disclosure, RFM command scheduling can be configured to follow the same minimum separation requirements as those for the REF command. In accordance with another aspect, the issuing of an RFM command will not take the place of a periodic REF command, nor would an RFM command affect internal refresh counters. Rather, the RFM commands are issued to provide supplemental time for the memory device to manage refresh operations internally.

According to another embodiment of the present disclosure, devices which require Refresh Management may not require RFM at every refresh rate multiplier. The Refresh Management Threshold value (RFMTH) defines a refresh interval (e.g., tREFIe) above which Refresh Management is required. RFMTH can be determined by the equation: RFMTH=RAAIMT*tRC. Operation at any refresh rate slower (i.e. longer tREFIe) than that indicated by RFMTH can be configured to enable RFM to ensure integrity of data stored in the memory device. Operation at the tREFIe indicated by RFMTH, or operation at any higher refresh rate (i.e. shorter tREFIe) can be configured to be exempt from RFM requirements regardless of any RAA count value.

Although in the foregoing example embodiments, refresh management implementations have been described and illustrated with respect to pre-bank granularity, in other embodiments refresh management implementation may also be configured to monitor ACT commands issued on a sub-bank basis. Because monitoring by sub-banks does not change the management threshold values, this can reduce the performance impact by reducing the number of required RFM commands when row accesses are distributed among sub-banks. Memory device support for sub-bank monitoring, and the number of sub-banks supported (RFMSB), can be indicated in a mode register of the memory device. If sub-bank monitoring is implemented by the memory controller, the corresponding RFMSB counter (RFMSBC) bits can be configured to indicate as much in the mode register of the memory device.

Figure 4:
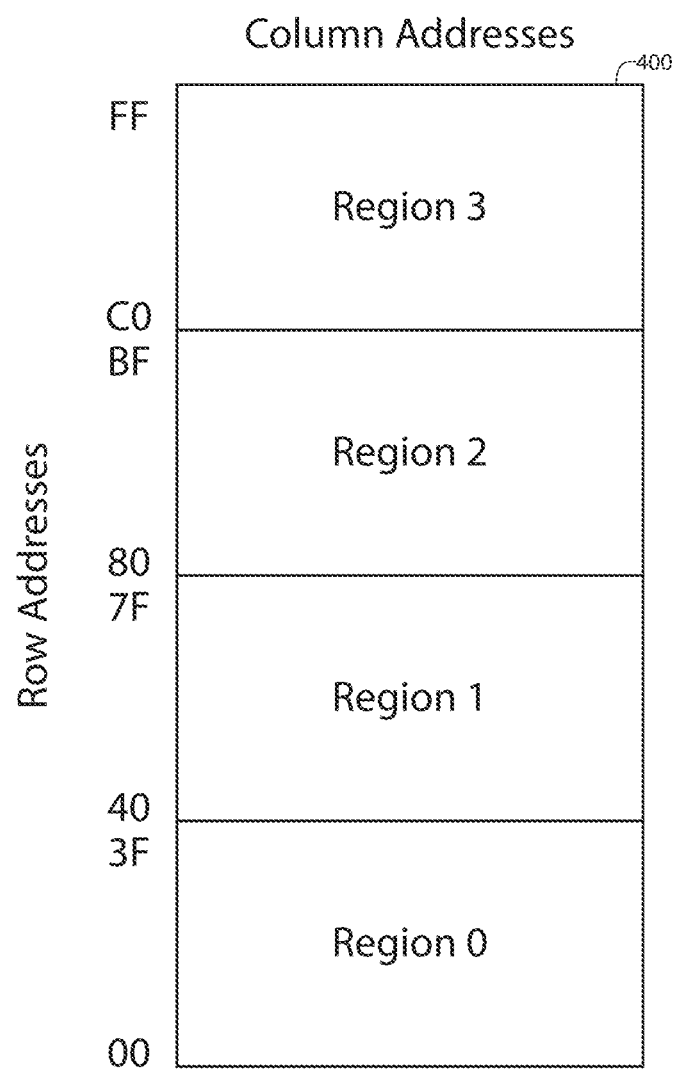
FIG. 4 is a simplified block diagram schematically illustrating sub-banks of a memory bank associated with sub-bank refresh management in accordance with an embodiment of the present technology.

According to one aspect of the disclosure, when RFMSB is greater than 1 the monitoring of ACT commands may be performed by dividing the row address space equally among the indicated number of regions. An example where RFMSB=4 is shown in FIG. 4, in which a simplified block diagram schematically illustrates four sub-banks of a memory bank associated with sub-bank refresh management in accordance with an embodiment of the present technology. As can be seen with reference to FIG. 4, the controller would be permitted to implement four RAA counters for each LPDRAM bank, such as bank 400 (e.g., one each for regions 0, 1, 2 and 3). In this implementation, the requirements for RFM commands are determined for each region separately, based on the same read-only parameters RAAIMT, RAAMULT, and RAADEC as the per-bank implementation described in greater detail above. Likewise, decrementing of the RAA counter for each sub-bank region can follow the same rules as decrementing the RAA counter on a per-bank basis. When RAA is tracked on a per-sub-bank basis, RFM commands can be configured to include the appropriate SB0 and SB1 bits to inform the DRAM which sub-bank requires the additional Refresh Management. When an RFMab command is issued and sub-bank management is enabled, the command can be applied to the sub-bank indicated by the SB0 and SB1 bit states for each refresh bank. That is, the RAA counter may be decremented for the same sub-bank region in each of the eight example refresh banks illustrated in FIG. 3 for an RFMab command. If the RAA counter for any sub-bank region within a bank reaches RAAMMT, additional ACT commands can be disallowed to that bank until one or more REF or RFM commands have been issued to reduce the RAA counter below the maximum value for all sub-bank regions.

According to another aspect of the present disclosure, monitoring of the sub-bank regions may be optional for a memory controller, and the sub-bank regions may be combined. For example, if a memory device supports four regions as in FIG. 4, the controller could optionally combine regions 0 and 1, and combine regions 2 and 3. In this case there would be two RAA monitors per bank, one tracking addresses 00-7F and another tracking addresses 80-FF. Making sub-bank implementation optional allows for all of the foregoing RFM operations to be performed while treating all sub-bank regions as a single bank.

Table 6, below, illustrates a number of example sub-bank refresh management operations of a memory device according to a variety of different device states, in accordance with one embodiment of the present disclosure.

TABLE 6

| | | | | | Device State | | |
|---|---|---|---|---|---|---|---|
| | | | RFMSB/ | | | | |
| RAAIMT | RAAMULT | RAADEC | RFMSBC | RFMTH | tREFIe | RAA | Behavior |
| 160 | 4x | 2x | 2/2 | 9600 ns | 15.6 μs | R0 = 640<br>R1 = 0 | No ACT to this bank until RFM or REF to R0 of this bank, since RAA = RAAMMT in at least one region. Issuing one RFMpb or RFMab with SB0 = 0 will reduce RAA for R0 to 320 since RAADEC = 2x. Issuing one REFpb or REFab will reduce RAA for R0 to 480. R1 RAA will remain at 0. |
| 160 | 4x | 2x | 2/2 | 9600 ns | 15.6 μs | R0 = 320<br>R1 = 320 | RAAIMT < RAA < RAAMMT for both regions, RFM command can be issued and postponed. Issuing two RFMpb or RFMab (one to each region of this bank) would reduce RAA to 0 for both regions. Issuing one REFpb or REFab will reduce RAA to 160 for both regions. |
| 160 | 4x | 2x | 4/2 | 9600 ns | 15.6 μs | R0 + 1 = 320<br>R2 + 3 = 320 | RAAIMT < RAA < RAAMMT for all regions, RFM command can be issued and postponed. Issuing two RFMpb or RFMab (one to each region of this bank) would reduce RAA to 0 for both regions. Issuing one REFpb or REFab will reduce RAA to 160 for both regions. |
| 160 | 4x | 2x | 4/4 | 9600 ns | 15.6 μs | R0 = 500<br>R1 = 500<br>R2 = 500<br>R3 = 500 | RAAIMT < RAA < RAAMMT for all regions, RFM command can be issued and postponed. Issuing four RFMpb or RFMab (one RFMpb to each region of this bank, or one RFMab to each sub-bank region) will reduce RAA for all regions to 180 since RAADEC = 2x. Issuing one REFpb or REFab will reduce RAA to 340 for all regions. |

In accordance with another embodiment of the present disclosure, the refresh management feature by which extra refresh operations can be scheduled on an as-needed basis for those memory portions where activity (e.g., activations in excess of a predetermined threshold) warrants an out-of-sequence refresh operation can optionally be enabled or disabled based upon a refresh rate multiplier of the memory device. For example, some devices that utilize one or more of the foregoing approaches to refresh management may be configured to disable the feature for one or more refresh rate multiplier(s). In this regard, the memory device can maintain in a mode register or other location a Refresh Management Threshold value (RFMTH) that specifies a tREFI multiplier at or above which refresh management is disabled. Operation of the memory device at a refresh rate slower than the threshold (e.g., operation with a longer tREFIe) can utilize the foregoing approach(es) to refresh management to ensure the integrity of data stored in the memory.

In yet another embodiment of the present disclosure, enabling and disabling a refresh management feature of a memory device can be performed based on still other operating characteristics of the memory device, or even based upon a user-selectable preference. In this regard, the feature can be configured to automatically enable and/or disable based on operating characteristics such as temperature, clock rate, voltage, the enabled/disabled status of one or more other memory features, or the like.

Figure 5:
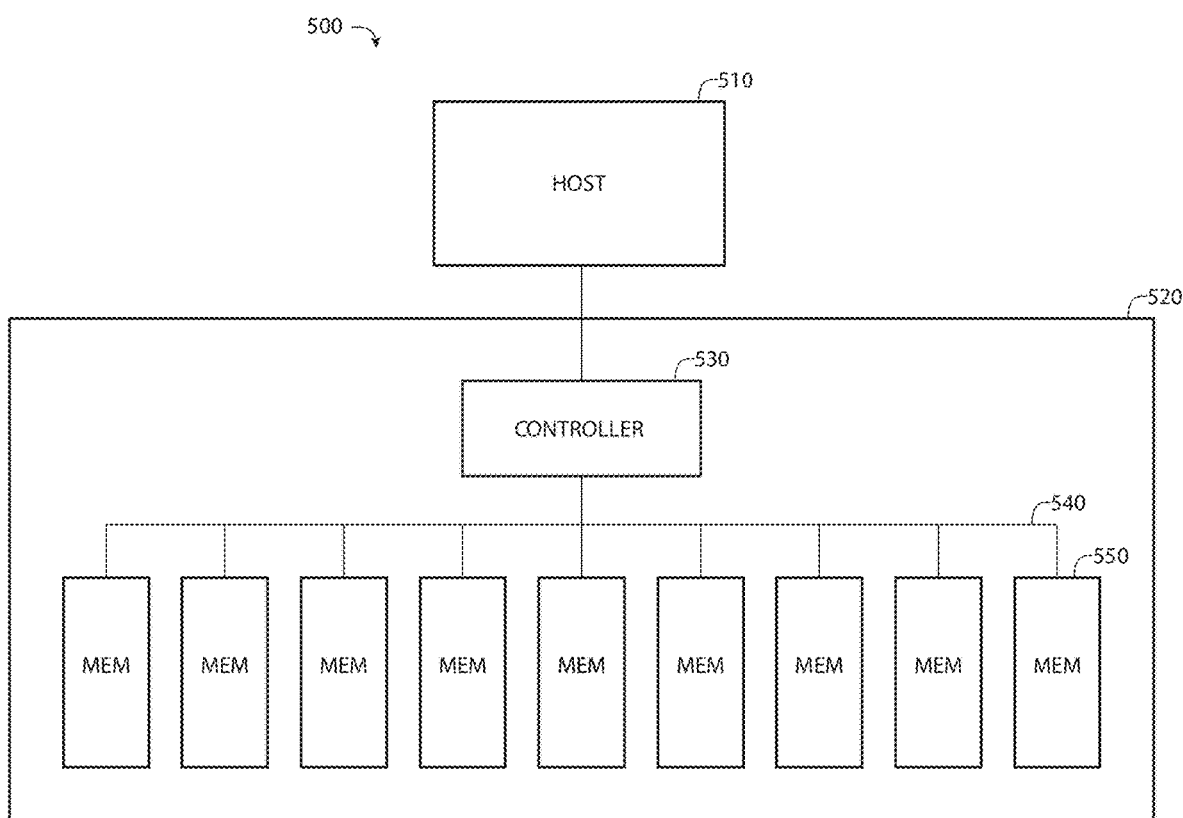
FIG. 5 is a simplified block diagram schematically illustrating a memory system in accordance with an embodiment of the present technology.

FIG. 5 is a simplified block diagram schematically illustrating a memory system 500 in accordance with an embodiment of the present technology. Memory system 500 includes a host device 510 operably coupled to a memory module 520 (e.g., a dual in-line memory module (DIMM)). Memory module 520 can include a controller 540 operably connected by a bus 540 to a plurality of memory devices 550. In accordance with one aspect of the present disclosure, the host device 510 can maintain a bank counter to track refresh operations (e.g., the subset of refresh operations not directed to row hammer mitigation), as set forth above in greater detail with respect to FIG. 3. In accordance with another aspect of the present disclosure, the host device 510 can issue refresh commands to the memory devices 550, either in accordance with a refresh schedule, in response to detected activity at the memory devices, or both.

Figure 6:
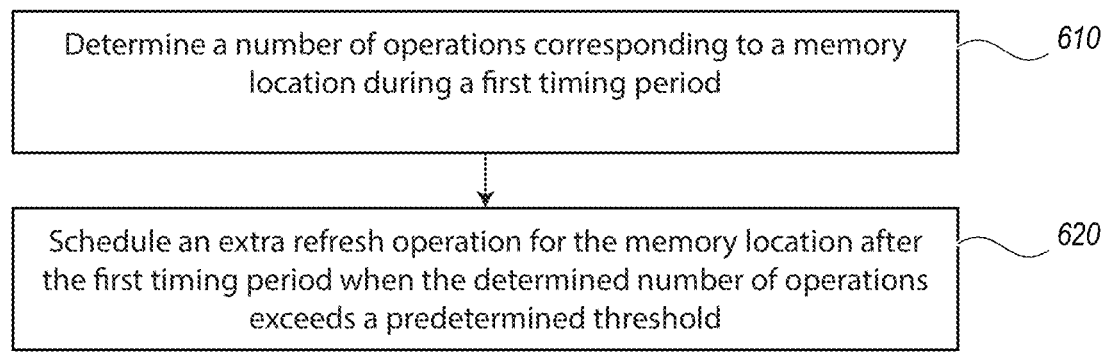
FIG. 6 is a flow chart illustrating a method of operating a memory system in accordance with an embodiment of the present technology.

FIG. 6 is a flow chart illustrating a method of operating a memory system in accordance with an embodiment of the present technology. The method includes determining a number of operations corresponding to a memory location during a first timing period (box 610). According to one aspect of the present disclosure, the determining features of box 610 may be implemented with a controller 440, as illustrated in FIG. 4 in greater detail, above. The method further includes scheduling an extra refresh operation for the memory location after the first timing period when the determined number of operations exceeds a predetermined threshold (box 620). According to one aspect of the present disclosure, the scheduling features of box 620 may be implemented with a controller 440, as illustrated in FIG. 4 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of operating a memory device, comprising:
   determining a number of operations corresponding to a memory location during a refresh period; and
   scheduling an extra non-periodic refresh operation for the memory location after the refresh period when the determined number of operations exceeds a predetermined threshold.

2. The method of claim 1, wherein the extra non-periodic refresh operation is scheduled at the completion of the refresh period if a periodic refresh operation is not already scheduled at the completion of the refresh period.

3. The method of claim 1, wherein the extra non-periodic refresh operation is scheduled at the completion of a second refresh period immediately following the refresh period if a periodic refresh operation is already scheduled at the completion of the refresh period.

4. The method of claim 1, further comprising:
   maintaining a count of refresh operations scheduled for the memory location.

5. The method of claim 4, wherein maintaining the count comprises determining repeated refresh commands to the same memory location without a corresponding increase in a refresh address counter.

6. The method of claim 1, wherein the operations comprise activations.

7. The method of claim 1, wherein the refresh period comprises a base refresh interval.

8. The method of claim 7, wherein the memory device is configured to be refreshed less often than every base refresh internal.

9. The method of claim 1, wherein the scheduling the extra non-periodic refresh operation is dependent upon a refresh rate multiplier of the memory device being below a predetermined threshold value.

10. A memory device, comprising:
    a memory including a memory location; and
    circuitry configured to:
       determine a number of operations corresponding to the memory location during a refresh period; and schedule an extra non-periodic refresh operation for the memory location after the refresh period when the determined number of operations exceeds a predetermined threshold.

11. The memory device of claim 10, wherein the circuitry is configured to schedule the extra non-periodic refresh operation at the completion of the refresh period if a periodic refresh operation is not already scheduled at the completion of the refresh period.

12. The memory device of claim 10, wherein the circuitry is configured to schedule the extra non-periodic refresh operation at the completion of a second refresh period immediately following the refresh period if a periodic refresh operation is already scheduled at the completion of the refresh period.

13. The memory device of claim 10, wherein the circuitry is further configured to maintain a count of refresh operations scheduled for the memory location.

14. The memory device of claim 13, wherein the circuitry is configured to maintain the count by determining repeated refresh commands to the same memory location without a corresponding increase in a refresh address counter.

15. The memory device of claim 10, wherein the operations comprise activations.

16. The memory device of claim 10, wherein the refresh period comprises a base refresh interval.

17. The memory device of claim 16, wherein the memory device is configured to be refreshed less often than every base refresh interval.

18. The memory device of claim 10, wherein the circuitry is further configured to maintain the determined number of operations in a counter of the memory device.

19. The memory device of claim 18, wherein the circuitry is configured to reset the counter upon completion of the refresh period.

20. The memory device of claim 10, wherein the circuitry is further configured to schedule the extra non-periodic refresh operation for the memory location in response to a determination that a refresh rate multiplier of the memory device is below a predetermined threshold value.

21. A system, comprising:
a memory device including a memory location; and
a memory controller operatively coupled to the memory device and configured to:
determine a number of operations corresponding to the memory location during a refresh period; and
schedule an extra non-periodic refresh operation for the memory location after the refresh period when the determined number of operations exceeds a predetermined threshold.

* * * * *

UNITED STATES PATENT AND TRADEMARK OFFICE
CERTIFICATE OF CORRECTION

PATENT NO. : 11,837,272 B2
APPLICATION NO. : 17/328419
DATED : December 5, 2023
INVENTOR(S) : Gans It is certified that error appears in the above-identified patent and that said Letters Patent is hereby corrected as shown below:

In the Claims

Claim 2 should read:
"The method of claim 1, wherein the extra non-periodic refresh operation is scheduled at a completion of the refresh period if a periodic refresh operation is not already scheduled at the completion of the refresh period."

Claim 3 should read:
"The method of claim 1, wherein the extra non-periodic refresh operation is scheduled at a completion of a second refresh period immediately following the refresh period if a periodic refresh operation is already scheduled at the completion of the refresh period."

Claim 5 should read:
"The method of claim 4, wherein maintaining the count comprises determining repeated refresh commands to a same memory location without a corresponding increase in a refresh address counter."

Claim 11 should read:
"The memory device of claim 10, wherein the circuitry is configured to schedule the extra non-periodic refresh operation at a completion of the refresh period if a periodic refresh operation is not already scheduled at the completion of the refresh period."

Claim 12 should read:
"The memory device of claim 10, wherein the circuitry is configured to schedule the extra non-periodic refresh operation at a completion of a second refresh period immediately following the refresh period if a periodic refresh operation is already scheduled at the completion of the refresh period."

Claim 14 should read:
"The memory device of claim 13, wherein the circuitry is configured to maintain the count by Signed and Sealed this
Thirtieth Day of September, 2025

John A. Squires
*Director of the United States Patent and Trademark Office* determining repeated refresh commands to a same memory location without a corresponding increase in a refresh address counter."